United States Patent
Convent et al.

(10) Patent No.: US 7,430,265 B2
(45) Date of Patent: Sep. 30, 2008

(54) CIRCUIT ARRANGEMENT PROVIDED WITH A PHASE-LOCKED LOOP AND TRANSMITTER-RECEIVER WITH SAID CIRCUIT ARRANGEMENT

(75) Inventors: Thomas Convent, Issum (DE); Markus Hammes, Dinslaken (DE); André Hanke, Düsseldorf (DE); Giuseppe Li Puma, Bochum (DE); Walter Mevissen, Düsseldorf (DE)

(73) Assignee: Infineon Technologies AG, Munich (DE)

( * ) Notice: Subject to any disclaimer, the term of this patent is extended or adjusted under 35 U.S.C. 154(b) by 476 days.

(21) Appl. No.: 11/018,379

(22) Filed: Dec. 21, 2004

(65) Prior Publication Data

US 2005/0185749 A1 Aug. 25, 2005

Related U.S. Application Data

(63) Continuation of application No. PCT/DE03/02118, filed on Jun. 25, 2003.

(30) Foreign Application Priority Data

Jun. 27, 2002 (DE) ............................... 102 28 759
Sep. 18, 2002 (DE) ............................... 102 43 382

(51) Int. Cl.
*H03D 3/24* (2006.01)
*H03L 7/06* (2006.01)

(52) U.S. Cl. ..................... 375/376; 327/147
(58) Field of Classification Search ................. 375/376, 375/327, 294, 373; 455/180.3; 327/147, 327/156; 332/127, 128

See application file for complete search history.

(56) References Cited

U.S. PATENT DOCUMENTS

| 5,210,539 | A | 5/1993 | Voyce | |
|---|---|---|---|---|
| 5,712,602 | A * | 1/1998 | Suematsu | ................... 332/127 |
| 5,949,830 | A | 9/1999 | Nakanishi | |
| 5,952,895 | A | 9/1999 | McCune, Jr. et al. | |
| 6,021,164 | A | 2/2000 | Park | |
| 6,515,553 | B1 * | 2/2003 | Filiol et al. | ................. 332/127 |
| 6,756,927 | B2 * | 6/2004 | Hammes et al. | ............. 341/143 |
| 7,075,383 | B2 * | 7/2006 | Adachi et al. | ................ 332/127 |

FOREIGN PATENT DOCUMENTS

| CN | 2438275 Y | 7/2001 |
|---|---|---|
| DE | 199 29 167 A1 | 12/2000 |
| EP | 0 423 941 B1 | 4/1991 |
| EP | 0 961 412 A1 | 12/1999 |
| WO | WO 01/93415 A1 | 12/2001 |

OTHER PUBLICATIONS

"Frequenzmodulation", E. G. Woschni, VEB Verlag Technik, Berlin, 1960, 7 pgs.

* cited by examiner

*Primary Examiner*—Khai Tran
(74) *Attorney, Agent, or Firm*—Eschweiler & Associates LLC

(57) ABSTRACT

The invention specifies a circuit arrangement with a phase locked loop (1), which can be used as a mobile radio transmitter, in particular. The reference frequency for the PLL (1), which is provided by means of the source (3), is multiplied by a multiplier (10) and is down-converted to an intermediate-frequency level in a down-conversion mixer (9) using the output signal from the PLL, and is evaluated such that a modulator (13) connected to the input of the oscillator (6) can be trimmed. The inventive principle is used to advantage in two-point modulators and allows inexpensive, integratable mobile radio transmitters with good noise characteristics.

13 Claims, 2 Drawing Sheets

TV: Duty ratio

CIRCUIT ARRANGEMENT PROVIDED WITH A PHASE-LOCKED LOOP AND TRANSMITTER-RECEIVER WITH SAID CIRCUIT ARRANGEMENT

REFERENCE TO RELATED APPLICATIONS

This application is a continuation of PCT/DE03/002118, filed Jun. 25, 2003, which was not published in English, that claims the benefit of the priority dates of German Patent Application Nos. 10228759.7, filed on Jun. 27, 2002, and 10243382.8, filed Sep. 18, 2002 the contents of which are herein incorporated by reference in their entirety.

FIELD OF THE INVENTION

The present invention relates to a circuit arrangement with a phase locked loop and to a transceiver with the circuit arrangement.

BACKGROUND OF THE INVENTION

A plurality of architectures for mobile radio transmitters are known which can be produced with little complexity. Particularly in the case of radio transmitters which operate using time slots, "bursts", it is appropriate to use "open loop modulation". In this case, a phase locked loop first locks onto the desired transmission frequency. Prior to the actual transmission of useful data, the control loop is opened and the carrier is modulated with the modulation signal while the control loop is open. However, this principle has the drawback that drift effects can cause the carrier frequency to change in open operation, which means that specifications cannot be observed any longer. This can be prevented using relatively complex stabilization devices.

It is also known practice to use "two-point modulation" as an alternative to the implementation of a radio transmitter concept for modern mobile radio systems. Two-point modulation involves the modulation signal being fed into a phase locked loop at two injection points. Of these two injection points for the control loop, one has high-pass characteristics and one has low-pass characteristics. While the modulation signal is being fed in, the phase locked loop remains closed in this case. Accordingly, the carrier's drift effects which arise during open loop modulation are avoided. Advantageously, two-point modulation allows the transmission of modulation signals whose bandwidth is greater than the actual modulation bandwidth of the phase locked loop. The actual bandwidth of the control loop can thus be of relatively small design, which in turn significantly improves the noise characteristics of the arrangement. In this case, a two-point modulator can be produced with relatively little complexity.

A two-point modulator of this type is specified in the printed document DE 199 29 167 A1. This document shows a phase locked loop (PLL) into which a modulation signal is fed both at a high-pass point at the input of the oscillator and at a low-pass point in the feedback path of the PLL.

In principle, there are a plurality of conceivable options for selecting the injection points for the modulation signal into the control loop. By way of example, the modulation signal may be supplied in digital form to a frequency divider in the feedback path of the phase locked loop, in which case this frequency divider normally operates as a fractional N divider. At the same time, the same modulation signal, but in analog-coded form, is fed in at an input on the oscillator in the phase locked loop, said oscillator normally being in the form of a voltage-controlled oscillator.

In the case of such two-point modulation with a combination of digital and analog modulation, it should be remembered that the analog and digital modulation signals are in phase and that there is a good match between the amplitudes of these two signals. Manufacturing tolerances (which are unavoidable in the case of mass production) in the device components, which are of significance to analog modulation and, by way of example, influence the modulation gradient, the modulation voltage generation etc., mean that it is necessary to perform amplitude trimming between the analog and the digital modulation following production of a radio transmitter of this type. If the intention is also to take into account temperature influences on the parameters of the devices used, it is desirable for such trimming to be carried out not just once during production but also prior to every transmission operation.

One option for performing this trimming is to receive a transmitted, modulated signal using an additional measuring receiver, to demodulate it, to measure the modulation swing and to perform trimming using the data obtained in this manner. The trimming information then needs to be stored in a memory in the appliance itself, however. In addition, this allows only production-related, but not temperature-related or aging-related, drift effects to be taken into account.

Another option might be to use the reception part of a transceiver to trim the transmission part. However, this would have the associated drawback that it would be necessary to provide an additional phase locked loop which, in the case of a heterodyne receiver, would need to be set to a frequency which corresponds to the differential frequency between the transmission frequency and the intermediate frequency.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention discloses a circuit arrangement with a phase locked loop and also a transceiver with the circuit arrangement which allow modulator trimming with a low level of circuit complexity.

In accordance with an aspect of the present invention, a circuit arrangement with a phase locked loop is disclosed, having a reference source, a phase detector, an oscillator, a modulator, and a trimming path. The reference source provides a signal at a reference frequency. The phase detector has a first input, which is connected to the reference source, a second input and an output. The oscillator has a control input, which is coupled to the output of the phase detector, and an output, which is coupled to the second input of the phase detector. The modulator has an output, which provides a modulation signal and is coupled to the control input of the oscillator. The trimming path, which performs trimming of the modulator, comprises a frequency mixer with a first input coupled to the output of the oscillator, a second input coupled to the reference source, and an output coupled to a control input on the modulator via a demodulator.

In line with the present principle, the output signal from the oscillator in the phase locked loop or a signal derived therefrom is mixed with the reference source's provided reference signal for the phase locked loop or with a signal derived therefrom. The output signal from this mixing operation, that is to say the output signal from the frequency mixer in the trimming path, is then demodulated and is supplied to a control input on the modulator for trimming purposes. It is thus possible to perform amplitude trimming with little complexity.

In the case of the present modulator, the principle described allows not only production-related tolerances but also temperature-related drift effects and aging effects to be compensated for.

The present principle is shown to particular advantage when the phase locked loop is developed to form a two-point modulator.

In this case, a frequency divider is provided in the feedback path of the phase locked loop, that is to say between the oscillator output and the second input of the phase comparator. This frequency divider can operate as a fractional N divider and is actuated by the modulation signal. The frequency divider is actuated with the modulation signal typically on a digital basis. A frequency divider of this type, designed for digital modulation, may also be actuated by the modulation signal using a sigma-delta converter.

In this case, the analog modulator, which actuates the oscillator, and the frequency divider are connected to a common modulation signal source.

In line with another development of the present principle, a frequency multiplier is provided which has an input, which is connected to the reference source, and which has an output, which is connected to the second input of the frequency mixer in the trimming path.

The frequency multiplier can be used, with little complexity, to down-convert the output signal from the phase locked loop to a frequency level which is accessible to the demodulation using the demodulator. In this case, the output frequency or signals derived therefrom is/are advantageously down-converted and demodulated with very little phase noise. In addition, a high level of integratability is obtained for the trimming path. The signal provided by the reference source in combination with the frequency multiplier thus operates as a local oscillator signal which is used to down-convert the output signal from the oscillator or a signal derived therefrom in the trimming path to an intermediate-frequency level.

In this context, the frequency multiplication can take place using an integer value, that is to say that the signal provided at the output of the frequency multiplier has a frequency which is the same as an integer multiple of the reference frequency provided by the reference source.

As an alternative to direct connection to the output of the oscillator, the first input of the frequency mixer may also be connected to the output of a frequency conditioning stage which is connected downstream of the oscillator.

Particularly in the case of integrated mobile radio transmitters, it is advantageous to condition the output signal from the oscillator such that the output signal from the overall arrangement has its frequency decoupled from the frequency at which the oscillator oscillates.

The modulator coupled to the control input of the oscillator is designed for analog modulation of the control signal for the oscillator.

To couple the demodulator to the modulator which actuates the oscillator at its control input, an evaluation unit is provided. The evaluation unit is designed to detect the analog modulation swing or a signal which is derived therefrom. The evaluation unit actuates the modulator on the basis of the present amplitude of the modulation.

In line with one development of the present invention, the phase locked loop is designed to have a voltage-controlled oscillator (VCO), and a charge pump circuit with a downstream loop filter is connected between the phase detector and the control input of the VCO for the purpose of conditioning the signal which can be derived at the output of the phase detector. The output of the loop filter is connected to the control input of the VCO, via a summing node, with a further input at the summing node which is connected to the modulator.

Alternatively, a VCO with two inputs, which may possibly have different gains, may also be provided.

With regard to the transceiver, a circuit arrangement with a phase locked loop as described above can be employed. The transceiver comprises a transmission path and a reception path. The actual phase locked loop is arranged in the transmission path, operating as a direct modulator. The trimming path in the circuit arrangement comprises the demodulator, which is arranged in the reception path, like the frequency mixer. Since a transceiver normally contains a demodulator and a frequency mixer in the reception path anyway which are designed to down-convert and demodulate a received useful signal, these may advantageously be used jointly by the inventively provided trimming arrangement.

Appropriate changeover switches or bandpass filters, "duplexers", are provided which can be used to change over between a trimming mode and a use mode for the reception path.

Further details and advantageous refinements of the invention are covered by the subclaims.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in more detail below using an exemplary embodiment with reference to the figure, in which.

DETAILED DESCRIPTION OF THE INVENTION

In the text below, identical reference symbols denote parts which are the same or have the same action.

In the case of such two-point modulation with a combination of digital and analog modulation, it should be remembered that the analog and digital modulation signals are in phase and that there is a good match between the amplitudes of these two signals. Manufacturing tolerances (which are unavoidable in the case of mass production) in the device components, which are of significance to analog modulation and, by way of example, influence the modulation gradient, the modulation voltage generation etc., mean that it is necessary to perform amplitude trimming between the analog and the digital modulation following production of a radio transmitter of this type. If the intention is also to take into account temperature influences on the parameters of the devices used, it is desirable for such trimming to be carried out not just once during production but also prior to every transmission operation.

One option for performing this trimming is to receive a transmitted, modulated signal using an additional measuring receiver, to demodulate it, to measure the modulation swing and to perform trimming using the data obtained in this manner. The trimming information then needs to be stored in a memory in the appliance itself, however. In addition, this allows only production-related, but not temperature-related or aging-related, drift effects to be taken into account.

Another option might be to use the reception part of a transceiver to trim the transmission part. However, this would have the associated drawback that it would be necessary to provide an additional phase locked loop which, in the case of a heterodyne receiver, would need to be set to a frequency which corresponds to the differential frequency between the transmission frequency and the intermediate frequency.

Figure 1:
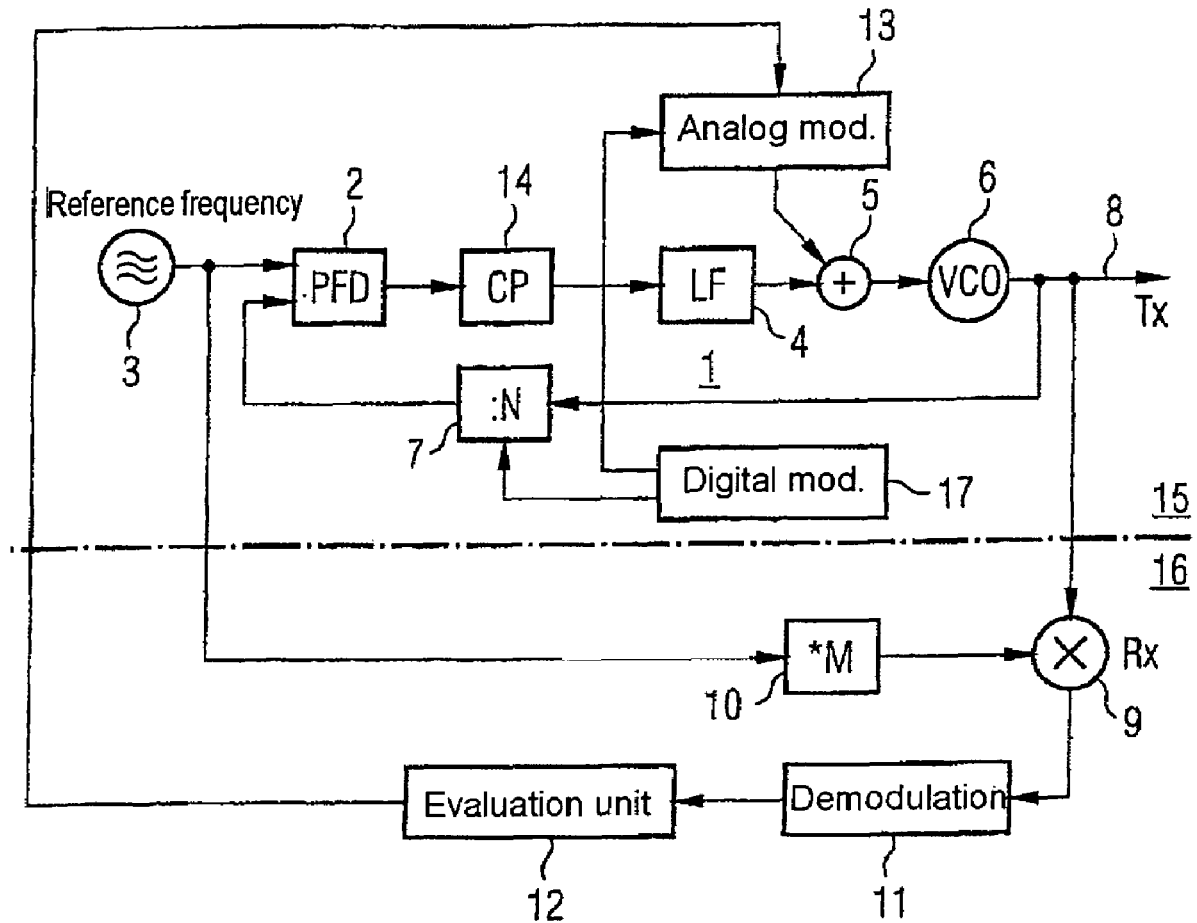
FIG. 1 shows a first exemplary embodiment of the proposed principle using a block diagram.

FIG. 1 shows a circuit arrangement with a phase locked loop 1. The circuit arrangement includes a trimming mechanism that performs trimming of analog and digital modulation signals. This trimming can account for manufacturing tolerances (which are unavoidable in the case of mass production) in the device components, which are of significance to analog modulation and, by way of example, influence the modulation gradient, the modulation voltage generation and the like. The circuit arrangement of FIG. 1 can perform this trimming without an additional receiver or additional phase locked loop. Additionally, the trimming mechanism is not limited to only production related drift effects and, for example, can include temperature-related or aging related drift effects to be taken into account.

The phase locked loop 1 comprises a phase detector 2 with a first input, a second input and with an output. The first input of the phase detector 2 has a reference frequency source 3 connected to it. The output of the phase detector 2 has a charge pump circuit 14 connected to it which has a loop filter 4 connected downstream of it. The output of the loop filter 4 has the first input of a summing element 5 connected to it, whose output is connected to the tuning input of a voltage-controlled oscillator 6. In a feedback path which comprises a frequency divider 7, the output of the oscillator 6 is connected to the second input of the phase detector 2. The frequency divider 7 performs integer division by N of the basic frequency. For this, the output of the oscillator 6, which also forms the output 8 of the overall circuit arrangement, is connected to an input on the frequency divider 7, whose output is connected to the second input of the phase detector 2. The frequency divider 7 has a digital control input to which a digital modulation signal can be supplied. This control input is connected to a modulation signal source 17 which delivers a digitally coded modulation signal. The summing element 5, whose first input is connected to the output of the loop filter 4, has a second input, which is connected to an analog modulator 13 and at which an analog-coded modulation signal is supplied. The modulation signal is supplied to the analog modulator by the modulation signal generator 17 which is connected thereto.

Since the modulation signal is thus fed into the phase locked loop 1 at two injection points in the phase locked loop (which is in the form of a modulator), namely at a high-pass and a low-pass injection point, the present circuit arrangement operates as a two-point modulator.

To provide trimming for the analog modulation, a down-conversion frequency mixer 9 is provided which has a first input, which is connected to the output of the oscillator 6, and which has a second input, which is connected to the output of a frequency multiplier 10. The frequency multiplier brings can employ integer multiplication of the signal frequency by the factor M. The input of the frequency multiplier 10 is connected to the output of the reference frequency source 3 (which is present anyway) for the PLL 1. The output of the down-conversion frequency mixer 9 is connected to the input of a demodulator 11, whose output is connected to the input of an evaluation unit 12. The output of the evaluation unit 12 is connected to a trimming input on the analog modulator 13, which is connected to the summing node 5.

The phase detector 2 compares the reference frequency with the divided-down output frequency from the oscillator and actuates the charge pump 14 on the basis of the phase difference between the two signals. Depending on the phase difference, the charge pump outputs a quantity of charge which is converted by means of the loop filter 4 into a corresponding control voltage for the oscillator 6. At the same time, the loop filter 4 serves to stabilize the control loop 1. The combination logic element 5 is used to superimpose an analog modulation signal on the control voltage for the oscillator 6, so that the output of the oscillator 6 provides a carrier signal which is modulated. This signal has its frequency divided down as appropriate using the frequency divider 7 in the feedback path. To increase the modulation bandwidth, the modulation signal supplied to the combination logic element 5 in analog form is simultaneously supplied in digitally coded form to the frequency divider 7 in the feedback path. There is thus a modulation bandwidth available which is greater than the bandwidth of the control loop 1. In order to be able to perform amplitude trimming between the analog and digital modulation, the frequency mixer 9 is provided, which uses the multiplied reference frequency for the PLL 1 to down-convert the output signal from the oscillator 6 to an intermediate-frequency level. This down-converted signal is demodulated in the demodulator 11. The evaluation unit 12 evaluates the demodulated modulation signal. The evaluation unit 12 detects the present analog modulation swing, ascertains a discrepancy between the latter and a nominal value and actuates the analog modulator 13 accordingly such that amplitude trimming takes place between the analog and digital modulation. This amplitude trimming compensates both for production-related tolerances and advantageously for temperature drifts and aging effects.

The multiplication of the reference frequency for the PLL 1 means that there is advantageously no need for an additional phase locked loop for the trimming in line with the present principle. Hence, good integration options are obtained for the present principle. In addition, frequency multiplication is possible with significantly less phase noise than generation of an oscillator frequency using a further phase locked loop. This is advantageous particularly because the phase noise is likewise down-converted to the intermediate frequency in the mixer 9. The phase noise also affects the demodulated signal as a result of the demodulation 11 and would therefore corrupt the trimming or make it impossible.

The present invention makes it possible to design a mobile radio transmitter with particularly little complexity, with a small number of necessary devices, with low power consumption and with a small chip area. The transmitter has good noise characteristics in this case.

Instead of the illustrated application of the inventive principle to two-point modulation, the principle described may also be applied in systems with exclusively analog modulation.

The demodulator 11 is arranged in the reception path 16 of a transceiver, whose transmission path 15 contains the phase locked loop 1, which is in the form of a two-point modulator. Additional switches, filters etc. for changing over between useful signal reception and the trimming mode of operation in the reception path 11 have not been shown in FIG. 1, but are within the scope of the invention.

Figure 2:
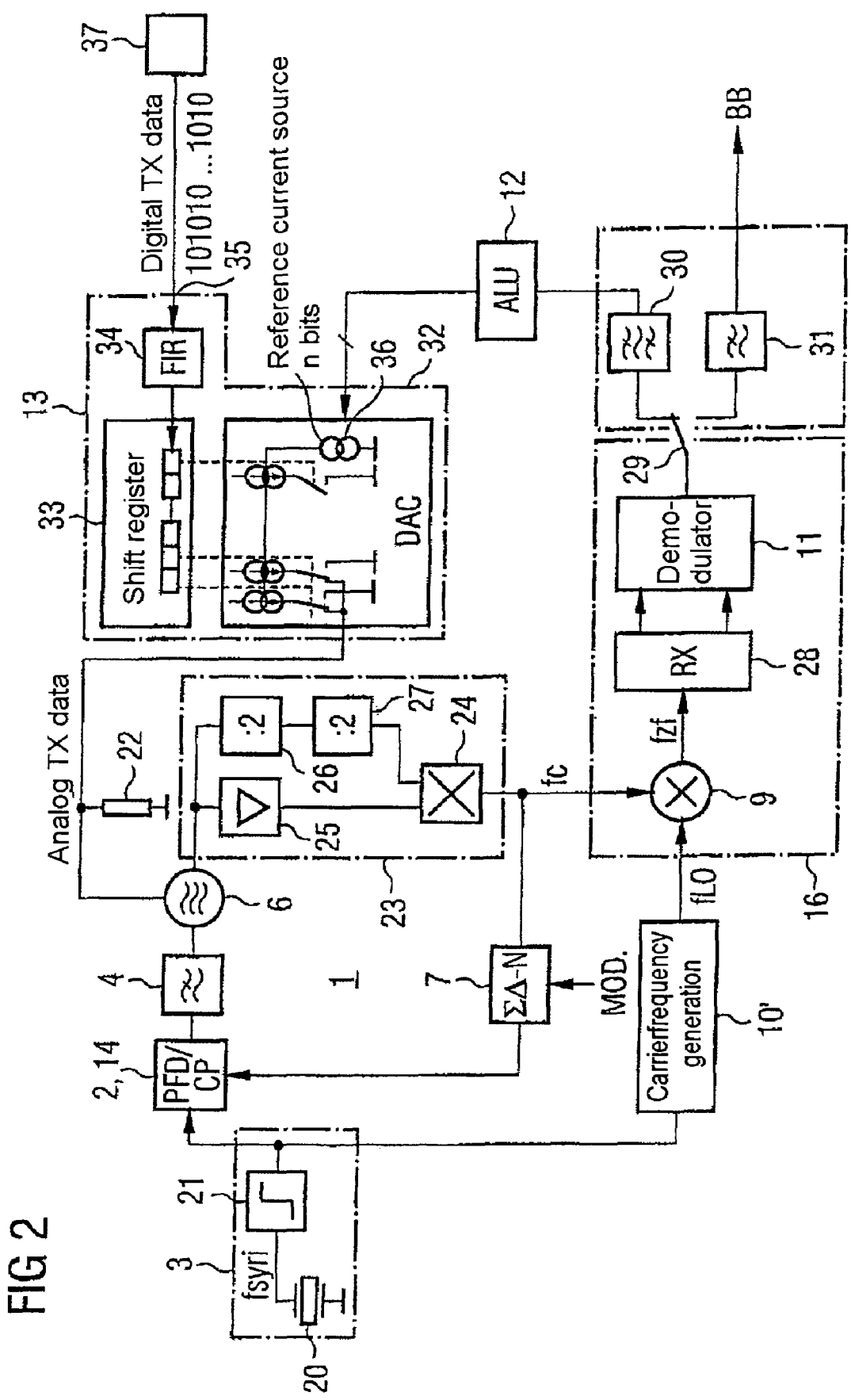
FIG. 2 shows a second exemplary embodiment of the proposed principle using a block diagram.

FIG. 2 shows a development of the basic illustration of a circuit arrangement with a phase locked loop, which is likewise based on the principle of two-point modulation. Insofar as the features in FIG. 2, the individual circuit parts, their interconnection and the advantageous interaction of said circuit parts match those in FIG. 1, this description is not repeated again.

The phase locked loop 1 in FIG. 2, which is designed for two-point modulation, comprises a reference generator 3 which has a crystal oscillator 20 with a downstream square-wave signal generator 21, which converts the sinusoidal oscillator signal from the crystal into a periodic square-wave signal. The output of the reference frequency generator 3 is connected to an input on the phase detector 2, which is shown in FIG. 2 as a unit with the charge pump 14. The output of this phase detector with a downstream charge pump 2, 14 has the voltage-controlled oscillator 6 connected to it via a low-pass filter 4. In the circuit in FIG. 2, the summing node 5 from FIG. 1 has been moved into the oscillator 6, which has two tuning inputs in the present case. In this context, the tuning inputs may be designed to have the same or a different gain. The further input of the oscillator 6 is designed to supply analog transmission data, that is to say analog modulation data, and is connected to reference potential via a resistor 22. The output of the oscillator 6 is coupled via a frequency conditioning circuit 23 to the input of a $\Sigma\Delta$ fractional N divider whose output is connected to a further input on the phase detector unit 2, 14.

In the present case, a two-point modulator is formed using two modulation signal injection points, one of which is provided at an input on the oscillator 6 and another of which is provided at a control input on the $\Sigma\Delta$ fractional N frequency divider.

The frequency conditioning circuit 23 comprises a radio-frequency mixer 24 with a first input, which is connected to the output of the oscillator 6 via a first signal path, and a second input, which is connected to the output of the oscillator 6 via a second signal path. The first signal path comprises an amplifier 25 for coupling the oscillator 6 and the mixer 24. The second signal path comprises a series circuit containing two frequency dividers 26, 27 which connect the output of the oscillator 6 to the second input of the mixer 24 and bring about respective frequency division by two. To trim the control loop 1, particularly the analog modulation thereof, a feedback path from the output of the conditioning circuit 23 to the analog modulation input of the oscillator 6 is formed which comprises, inter alia, the frequency mixer 9, the demodulator 11, the evaluation unit 12 and the analog modulator 13.

The first input of the frequency mixer 9 is connected to the output of the conditioning circuit 23, and thereto the output of the mixer 24. The local oscillator signal input of the mixer 9 is connected to the output of the carrier frequency generation circuit 10', whose input is connected to the output of the reference generator 3, like the phase detector 2. Unlike in the circuit in FIG. 1, however, the carrier frequency generation circuit 10' is not in the form of a frequency multiplier, but rather is in the form of a pulse conversion circuit which converts the duty ratio of 50% of the reference frequency signal into a signal with a significantly lower duty ratio TV, that is to say to give a duty ratio TV'<<50%. The output of the frequency mixer 9 is connected to a received signal conditioning circuit 28 which comprises a filter with a downstream limiter, that is to say a limiting amplifier. The output of this reception block 28 is connected to the input of a frequency demodulator 11. The frequency mixer 9, reception conditioning 28 and demodulator 11 blocks together form part of the received signal path 16 in a radio receiver.

The output of the demodulator 11 has a switch connected to it which bears the reference symbol 29 and connects the demodulator output either to a narrowband filter 30 or to a low-pass filter 31. The low pass filter 31 is followed by a baseband signal processing chain in the receiver. By contrast, the output of the narrow band filter 30 has an evaluation unit 12 connected to it which comprises a control logic unit and an ALU (Arithmetic Logical Unit). The latter outputs a digital, parallel control signal for influencing the analog modulation, for which purpose its output is connected to the input of a digital/analog converter 32.

The D/A converter 32 is arranged in an analog modulator unit 13 together with a shift register 33 and an FIR filter 24. Digital transmission data which are intended to be used to modulate a carrier signal can be supplied to an input 35 on the filter 34. For this purpose, a test data generator 37 is connected to the input of the filter 34, said test data generator being designed to generate periodic bit patterns. The output of the FIR filter 34 actuates the serial input of a shift register 33 which is used for serial/parallel conversion. The parallel output of the shift register 33 has a respective switchable current source coupled to it in the D/A converter 32. The evaluation unit 12 is connected to the control input of a reference current source in the D/A converter 32 in order to control the reference current for the current sources thereof. Accordingly, the output provides a current signal which is dependent both on the calibration value which is fed back and on the transmission data. The evaluation unit 12 calibrates the current value which is provided by the D/A converter and is generated on the basis of the reference current value and the digital transmission data at the input 35.

The signal conditioning circuit 23 advantageously allows the oscillation frequency of the oscillator 6 to be decoupled from the carrier frequency, so that unwanted interference signals are prevented from being coupled.

The phase locked loop 1 comprises two injection points, one of which has low-pass characteristics and one of which has high-pass characteristics. The digital component of the modulation signal is supplied to the $\Sigma\Delta$ fractional N divider 7, which performs $\Sigma\Delta$ modulation. By contrast, having been weighted using a high-pass transfer function, the analog component of the modulation signal acts on the output signal from the control loop and is fed in on the VCO 6. The digital modulation swing is set exactly to the desired nominal value. Production tolerances and drift effects are trimmed by virtue of the described trimming of the analog modulation swing. To measure the modulation swing, a rapid succession of 1010 level changes is fed in at the input 35, the carrier is thus modulated and the modulation swing is measured. The high-pass action for the analog modulation means that such, rapid changes for the components of the modulation allow conclusions to be drawn about the magnitude of the analog modulation signal without including any component of the control action of the loop or of the digital modulation as an influence.

This principle affords the additional advantage that the control loop remains closed, that is to say is subject to no influences regarding drift etc., for the whole time during measurement of the modulation swing. The output signal is determined exclusively by the component of the analog modulation. Since upward frequency conversion always has an associated increase in the phase noise, said phase noise being unavoidable and also being transferred concurrently into the intermediate-frequency signal during the mixing operation, this additional noise is also taken into account. The noise manifests itself as a residual frequency modulation component following the demodulation. To this end, the maximum and minimum are can be measured over a correspondingly long number of 101010 excursions by the test signal supplied at the input 35. The resultant mean value then corresponds to the present analog modulation, which is readjusted accordingly using the reference current source in the D/A converter 36.

As an alternative to mean-value formation after measuring the minimum and maximum, the arithmetic mean value could also be determined using a multiplicity of measurements of the modulation swing.

It goes without saying that other options for determining the actual modulation swing which are within the scope of the invention are also conceivable.

It is important to remember that the number of measured values taken into account is regulated on the basis of the possible arising frequency component of the phase noise so that frequency components which occur are averaged out as appropriate.

An additional improvement in the suppression of unwanted frequency components is obtained as a result of inserting the narrowband filter 30, which is connected into the feedback loop of the calibration path for the calibration mode, that is to say while the test signal is being fed in at the input 35. This filters out further frequency components of the noise following the demodulation.

Carrier frequency generation 10' may be performed, by way of example, using a simple frequency multiplier, a phase locked loop or a delay locked loop.

It has been found that it may be appropriate, depending on the application, to have a bit sequence 11001100 . . . generated by the test data generator. It goes without saying that within the scope of the invention it is also possible to use any other, periodic bit pattern sequences for calibrating the modulation in the control loop in line with the principle presented. When the narrowband filter 30 is used, its transmission characteristic needs to be aligned as appropriate.

Figure 3:
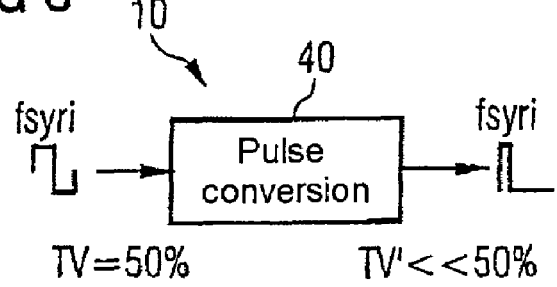
FIG. 3 shows an exemplary embodiment of the carrier frequency generation circuit from FIG. 2.

FIG. 3 shows a further option for implementing the carrier frequency generation circuit 10' for generating a local oscillator frequency for the frequency mixer 9. This is based on the principle of pulse conversion using a pulse conversion block 40 whose input is connected to the output of the frequency generator 3.

This output is used to supply a periodic square-wave signal having a symmetrical duty ratio, that is to say a duty ratio TV=50%.

The duty ratio is understood in this case to be the quotient of the logic high level divided by the period duration.

The pulse shaping circuit 40 prompts its output to provide a reference signal having a significantly reduced duty ratio. The duty ratio TV' at the output of the pulse conversion circuit 40 is low at around 50%. This achieves the desired frequency multiplication, which brings about the desired, advantageous effect as explained above when the mixer 9 is actuated.

While, for purposes of simplicity of explanation, the methodologies described above are depicted and described as executing serially. However, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

What is claimed is:

1. A circuit arrangement with a phase locked loop comprising:
   a reference source that provides a reference signal at a reference frequency;
   a phase detector having a first input connected to the reference source, a second input and an output;
   an oscillator having a control input coupled to the output of the phase detector and an output coupled to the second input of the phase detector;
   a modulator having an output and a control input, wherein the output provides a modulation signal to the control input of the oscillator; and
   a trimming path for trimming the modulator comprising a frequency mixer having a first input coupled to the output of the oscillator, a second input coupled to the reference source, and an output coupled to the control input of the modulator via a demodulator.

2. The circuit arrangement of claim 1, wherein the output of the oscillator is coupled to the second input of the phase detector by providing a frequency divider for the purpose of dividing down an output signal from the oscillator.

3. The circuit arrangement of claim 2, wherein the frequency divider has a control input to supply the modulation signal in digitally coded form.

4. The circuit arrangement of claim 1, further comprising a frequency multiplier that couples the second input of the frequency mixer to the reference source, wherein the frequency multiplies the reference frequency.

5. The circuit arrangement of claim 1, further comprising an evaluation unit that couples the demodulator to the control input of the modulator.

6. The circuit arrangement of claim 1, further comprising a low-pass filter coupled to the demodulator and an evaluation unit coupled to the demodulator and the modulator.

7. The circuit arrangement of claim 1, further comprising a switch connected to the demodulator, a bandpass filter connected to the switch, and an evaluation unit connected to the bandpass filter and the modulator, wherein a passband of the bandpass filter matches the frequency of the periodic signal generated by a test data generator.

8. The circuit arrangement of claim 1, further comprising a bandpass filter connected to the demodulator and an evaluation unit connected to the bandpass filter and the modulator, wherein a passband of the bandpass filter matches the frequency of the periodic signal generated by a test data generator.

9. The circuit arrangement of claim 1, wherein the oscillator is a voltage controlled oscillator and the circuit arrange further comprises a charge pump, a loop filter, and a summing node, wherein the charge pump is connected to the output of the phase detector, the loop filter is connected to the charge pump, the summing node has a first input connected to the loop filter and an output connected to the control input of the oscillator.

10. The circuit arrangement of claim 8, wherein a second input of the summing node is connected to the output of the modulator.

11. The circuit arrangement of claim 1, further comprising a test data generator that generates a periodic signal and has an output connected to an input of the modulator, wherein the modulator generates a demodulated signal according to the periodic signal and provides the demodulated signal to a further input of the oscillator.

12. A transceiver comprising:
   a circuit arrangement with a phase locked loop comprising:

a reference source that provides a signal at a reference frequency;

a phase detector having a first input connected to the reference source, a second input and an output;

an oscillator having a control input coupled to the output of the phase detector and an output coupled to the second input of the phase detector;

a modulator having an output and an input, wherein the output provides a modulation signal to the control input of the oscillator; and a trimming path for trimming the modulator comprising a frequency mixer having a first input coupled to the output of the oscillator, a second input coupled to the reference source, and an output coupled to the control input of the modulator via a demodulator;

a transmission path for transmitting a modulated signal which contains the circuit arrangement with a phase locked loop operating as a direct modulator; and a reception path for receiving a modulated signal which contains the demodulator.

13. The circuit arrangement of claim 1, wherein the reference source is configured to generate the reference signal as an unmodulated reference signal.

* * * * *